United States Patent
He et al.

(10) Patent No.: US 11,935,617 B2
(45) Date of Patent: Mar. 19, 2024

(54) NON-DESTRUCTIVE PATTERN IDENTIFICATION AT A MEMORY DEVICE

(71) Applicant: Micron Technology, Inc., Boise, ID (US)

(72) Inventors: Yuan He, Boise, ID (US); Takamasa Suzuki, Tokyo (JP)

(73) Assignee: Micron Technology, Inc., Boise, ID (US)

(*) Notice: Subject to any disclaimer, the term of this patent is extended or adjusted under 35 U.S.C. 154(b) by 46 days.

(21) Appl. No.: 17/716,580

(22) Filed: Apr. 8, 2022

(65) Prior Publication Data

US 2023/0326494 A1 Oct. 12, 2023

(51) Int. Cl.
*G11C 7/00* (2006.01)
*G11C 7/10* (2006.01)
*G11C 8/08* (2006.01)

(52) U.S. Cl.
CPC ............ *G11C 7/1039* (2013.01); *G11C 7/106* (2013.01); *G11C 7/1087* (2013.01); *G11C 8/08* (2013.01)

(58) Field of Classification Search
CPC ...................................................... G11C 7/062
USPC ...................................................... 365/189.07
See application file for complete search history.

(56) References Cited

U.S. PATENT DOCUMENTS

| | | | |
|---|---|---|---|
| 6,195,771 B1* | 2/2001 | Tanabe | G11C 29/44 365/201 |
| 6,961,810 B2 | 11/2005 | Srinivasan et al. | |
| 2009/0052227 A1* | 2/2009 | Edahiro | H01L 27/101 365/205 |
| 2013/0010550 A1* | 1/2013 | Kim | G11C 7/1006 365/189.15 |

* cited by examiner

*Primary Examiner* — Hoai V Ho
(74) *Attorney, Agent, or Firm* — Holland & Hart LLP

(57) ABSTRACT

Methods, systems, and devices for non-destructive pattern identification at a memory device are described. A memory device may perform pattern identification within the memory device and output a flag indicating whether a first data pattern matches with a second data pattern. The memory device may access one or more memory cells, via a word line, and latch the second data pattern of the memory cells to a sense amplifier. The memory device may deactivate the word line, which may result in isolating the memory cells from potential destruction of data. The memory device may write a first data pattern to the sense amplifier and compare the first data pattern and second data pattern at the sense amplifier. The memory device may output a signal indicating whether the data patterns match.

20 Claims, 10 Drawing Sheets

NON-DESTRUCTIVE PATTERN IDENTIFICATION AT A MEMORY DEVICE

FIELD OF TECHNOLOGY

The following relates to one or more systems for memory, including non-destructive pattern identification at a memory device.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, not-or (NOR) and not-and (NAND) memory devices, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source.

DETAILED DESCRIPTION

Figure 1:
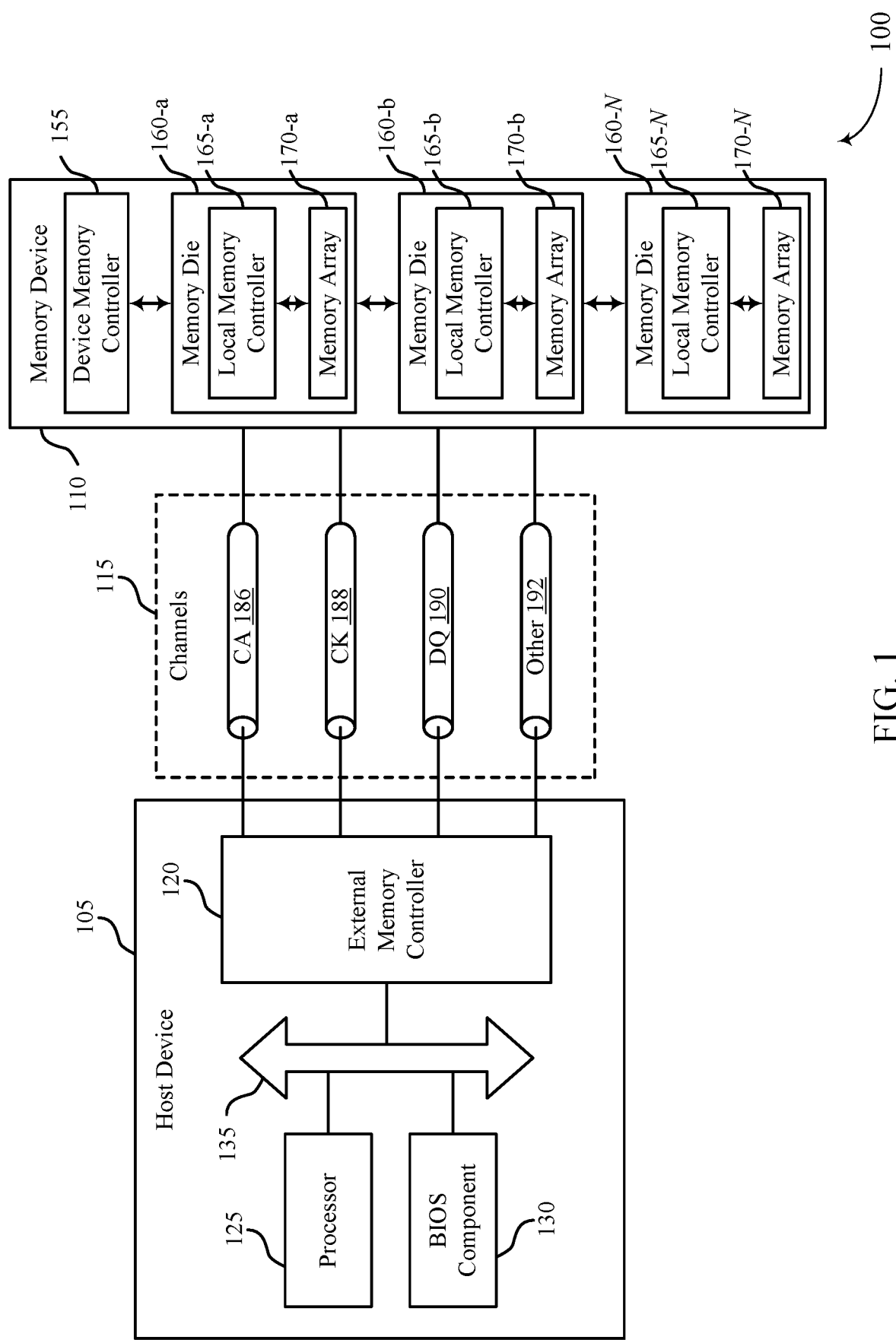
FIG. 1 illustrates an example of a system that supports non-destructive pattern identification at a memory device in accordance with examples as disclosed herein.

Some devices may perform various operations associated with pattern identification (e.g., pattern matching). For example, a device may execute various algorithms associated with artificial intelligence, machine learning, neural networks, deep learning, and the like, which utilize pattern identification to refine decision making or "learn" how to come to a desired conclusion, among other uses and examples of pattern identification. In some cases, a host device (e.g., a system on a chip (SoC)) may read out data stored in a memory device and compare the data to a pattern one by one (e.g., bit by bit) to identity if the stored data is the same as the pattern. However, such pattern identification may result in relatively high power consumption, low speed (e.g., high latency), corrupted data (e.g., due to reading out and comparing the data), or any combination thereof.

The techniques described herein enable a memory device to perform pattern identification operations at the memory device and output a result of such operations to a host device, which may result in increased speed, reduced power, or both. For example, a memory device may perform pattern identification within the memory device and output a flag indicating whether a first data pattern (e.g., inputted data) matches with a second data pattern (e.g., stored data). In some cases, the memory device may access one or more memory cells, via a word line. The memory device may latch the stored data of the memory cells to one or more sense amplifiers. The memory device may deactivate the word line, which may result in isolating the memory cells from potential destruction (e.g., corruption) of data as a result of the pattern identification. The memory device may write inputted data to the one or more sense amplifiers. The memory device may determine whether the data pattern stored at the memory cells and latched at the sense amplifiers matches the inputted data pattern based on the writing. For example, a voltage of a digit line may change or remain the same based on whether the written data matches the latched data (e.g., the change in voltage may satisfy a threshold if there is a mismatch in the data, and the sense amplifier may output a signal based on the voltage satisfying the threshold). The memory device may output an indication (e.g., a flag) of whether the stored data and the inputted data match.

In some cases, the memory device may utilize a current mirror to amplify current generated by the change in voltage, which may enable the memory device to detect pattern mismatches relatively consistently, accurately, or both. Additionally, or alternatively, the memory device may utilize biasing circuitry to produce a condition (e.g., a fighting condition) at the sense amplifier based on a voltage change of the digit line, which may hold current generation for a relatively longer period of time and create an amount of current that may satisfy the threshold.

Features of the disclosure are initially described in the context of systems and dies as described with reference to FIGS. 1 and 2. Features of the disclosure are described in the context of systems, circuits, and timelines as described with reference to FIGS. 3-8. These and other features of the disclosure are further illustrated by and described with reference to an apparatus diagram and flowcharts that relate to non-destructive pattern identification at a memory device as described with reference to FIGS. 9 and 10.

FIG. 1 illustrates an example of a system 100 that supports non-destructive pattern identification at a memory device in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system 100 that is operable to store data for one or more other components of the system 100.

Portions of the system 100 may be examples of the host device 105. The host device 105 may be an example of a processor (e.g., circuitry, processing circuitry, a processing component) within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host (e.g., host device 105).

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other functions.

The memory device 110 may be operable to store data for the components of the host device 105. In some examples, the memory device 110 (e.g., operating as a secondary-type device to the host device 105, operating as a dependent-type device to the host device 105) may respond to and execute commands provided by the host device 105 through the external memory controller 120. Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide functionality (e.g., control functionality) for the system 100 or the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include instructions (e.g., a program, software) stored in one or more of read-only memory (ROM), flash memory, or other non-volatile memory.

The memory device 110 may include a device memory controller 155 and one or more memory dies 160 (e.g., memory chips) to support a capacity (e.g., a desired capacity, a specified capacity) for data storage. Each memory die 160 (e.g., memory die 160-a, memory die 160-b, memory die 160-N) may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store one or more bits of data. A memory device 110 including two or more memory dies 160 may be referred to as a multi-die memory or a multi-die package or a multi-chip memory or a multi-chip package.

A memory die 160 may be an example of a two-dimensional (2D) array of memory cells or may be an example of a three-dimensional (3D) array of memory cells. In some examples, a 2D memory die 160 may include a single memory array 170. In some examples, a 3D memory die 160 may include two or more memory arrays 170, which may be stacked on top of one another or positioned next to one another (e.g., relative to a substrate). In some examples, memory arrays 170 in a 3D memory die 160 may be referred to as or otherwise include different sets (e.g., decks, levels, materials, dies). A 3D memory die 160 may include any quantity of stacked memory arrays 170 (e.g., two high, three high, four high, five high, six high, seven high, eight high). In some 3D memory dies 160, different decks may share a common access line such that some decks may share one or more of a word line, a digit line, or a plate line.

The device memory controller 155 may include components (e.g., circuitry, logic) operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive information (e.g., data, commands, or both) from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include components (e.g., circuitry, logic) operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other components operable for supporting described operations of the device memory controller 155 or local memory controller 165 or both.

The external memory controller 120 may be operable to enable communication of information (e.g., data, commands, or both) between components of the system 100 (e.g., between components of the host device 105, such as the processor 125, and the memory device 110). The external memory controller 120 may process (e.g., convert, translate) communications exchanged between the components of the host device 105 and the memory device 110. In some examples, the external memory controller 120, or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be an example of a transmission medium that carries information between the host device 105 and the memory device 110. Each channel 115 may include one or more signal paths (e.g., a transmission medium, a conductor) between terminals associated with the components of the system 100. A signal path may be an example of a conductive path operable to carry a signal. For example, a channel 115 may be associated with a first terminal (e.g., including one or more pins, including one or more pads) at the host device 105 and a second terminal at the memory device 110. A terminal may be an example of a conductive input or output point of a device of the system 100, and a terminal may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate commands between the host device 105 and the memory device 110 including control information associated with the commands (e.g., address information). For example, commands carried by the CA channel 186 may include a read command with an address of the desired data. In some examples, a CA channel 186 may include any quantity of signal paths (e.g., eight or nine signal paths) to communicate control information (e.g., commands or addresses).

The techniques described herein enable a memory device to perform pattern identification operations at the memory device 110 and output a result of such operations to the host device 105, which may result in increased speed, reduced power, or both. For example, the memory device 110 may perform pattern identification within the memory device 110 and output a flag indicating whether a first data pattern (e.g., inputted data) matches with a second data pattern (e.g., stored data). In some cases, the memory device 110 may access one or more memory cells, via a word line, and latch the stored data of the memory cells to a sense amplifier. The memory device 110 may deactivate the word line, which may result in isolating the memory cells from potential destruction (e.g., corruption) of data. The memory device 110 may write inputted data to the sense amplifier and compare the inputted data and the stored data at the sense amplifier. For example, a voltage of a digit line (e.g., data line) associated with the sense amplifier may change, where the change in voltage may satisfy (e.g., surpass) a threshold voltage to indicate a mismatch in data, and the sense amplifier may output a signal based on the voltage satisfying the threshold voltage. Based on the signal, the memory device 110 may output an indication (e.g., a flag) of whether the stored data and the inputted data match. In some cases, the change in voltage may be relatively small. Accordingly, the memory device 110 may utilize a current mirror to amplify current generated by the change in voltage to satisfy the threshold and thereby detect a mismatch. Additionally, or alternatively, the memory device 110 may utilize biasing circuitry to produce a condition (e.g., a fighting condition) at the sense amplifier upon a voltage change, which may hold current generation for a relatively longer period of time and create an amount of current that may satisfy the threshold.

Figure 2:
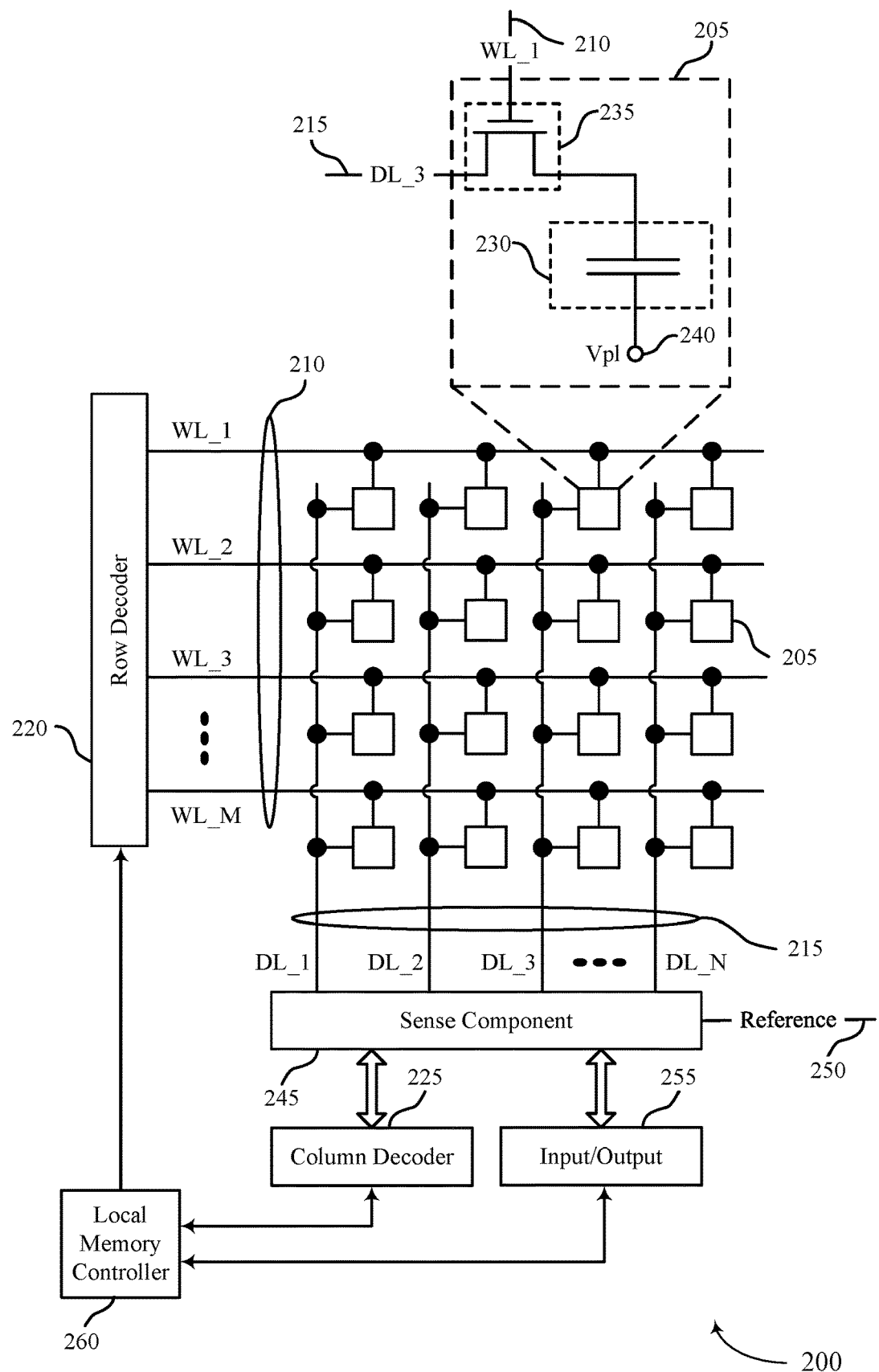
FIG. 2 illustrates an example of a memory die that supports non-destructive pattern identification at a memory device in accordance with examples as disclosed herein.

FIG. 2 illustrates an example of a memory die 200 that supports non-destructive pattern identification at a memory device in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

In some examples, a memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235 (e.g., a cell selection component). The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory die 200 may include access lines (e.g., word lines 210 and digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding. Memory cells 205 may be positioned at intersections of the word lines 210 and the digit lines 215.

Operations such as reading and writing may be performed on the memory cells 205 by activating access lines such as a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in a two-dimensional or in a three-dimensional configuration may be referred to as an address of a memory cell 205. Activating a word line 210 or a digit line 215 may include applying a voltage to the respective line.

Accessing the memory cells 205 may be controlled through a row decoder 220, or a column decoder 225, or a combination thereof. For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

A word line 210 may be a conductive line in electronic communication with a memory cell 205 that is used to perform access operations on the memory cell 205. In some architectures, the word line 210 may be coupled with a gate of a switching component 235 of a memory cell 205 and may be operable to control the switching component 235 of the memory cell. In some architectures, the word line 210 may be coupled with a node of the capacitor of the memory cell 205 and the memory cell 205 may not include a switching component.

A digit line 215 may be a conductive line that couples the memory cell 205 with a sense component 245. In some architectures, the memory cell 205 may be selectively coupled with the digit line 215 during portions of an access operation. For example, the word line 210 and the switching component 235 of the memory cell 205 may be operable to couple or isolate the capacitor 230 of the memory cell 205 and the digit line 215. In some architectures, the memory cell 205 may be coupled with the digit line 215.

The sense component 245 (e.g., a sense amplifier) may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device (e.g., a memory device 110) that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host (e.g., a host device 105) based on performing the one or more operations. The local memory controller 260 may generate row signals and column address signals to activate the target word line 210 and the target digit line 215. The local memory controller 260 also may generate and control various signals (e.g., voltages, currents) used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

The local memory controller 260 may be operable to perform a write operation (e.g., a programming operation) on one or more memory cells 205 of the memory die 200. During a write operation, a memory cell 205 of the memory die 200 may be programmed to store a desired state (e.g., logic state, charge state). The local memory controller 260 may identify a target memory cell 205 on which to perform the write operation. The local memory controller 260 may identify a target word line 210 and a target digit line 215 coupled with the target memory cell 205 (e.g., an address of the target memory cell 205). The local memory controller 260 may activate the target word line 210 and the target digit line 215 (e.g., applying a voltage to the word line 210 or digit line 215) to access the target memory cell 205. The local memory controller 260 may apply a signal (e.g., a write pulse, a write voltage) to the digit line 215 during the write operation to store a specific state (e.g., charge) in the capacitor 230 of the memory cell 205. The signal used as part of the write operation may include one or more voltage levels over a duration.

The local memory controller 260 may be operable to perform a read operation (e.g., a sense operation) on one or more memory cells 205 of the memory die 200. During a read operation, the state (e.g., logic state, charge state) stored in a memory cell 205 of the memory die 200 may be evaluated (e.g., read, determined, identified). The local memory controller 260 may identify a target memory cell 205 on which to perform the read operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The target memory cell 205 may transfer a signal (e.g., charge, voltage) to the sense component 245 in response to biasing the access lines. The sense component 245 may amplify the signal. The local memory controller 260 may activate the sense component 245 (e.g., latch the sense component) and compare the signal received from the memory cell 205 to a reference (e.g., the reference 250). Based on that comparison, the sense component 245 may determine a logic state that is stored on the memory cell 205.

In some cases, a memory device 110 may perform pattern identification operations at the memory device 110 and output a result of such operations to the host device 105, which may result in increased speed, reduced power, or both. The techniques described herein may be associated with a power bus sensing scheme to determine if data matches. For example, the memory device 110 may perform pattern identification within the memory device 110 and output a flag indicating whether a first data pattern (e.g., inputted data) matches with a second data pattern (e.g., stored data), such that the host device 105 may determine whether the first data pattern and the second data pattern match based on the flag. In some cases, the memory device 110 may access one or more memory cells 205, via a word line 210, and latch the stored data of the memory cells 205 to a sense component 245. The memory device 110 may deactivate the word line 210, which may result in isolating the memory cells 205 from potential destruction (e.g., corruption) of data. The memory device 110 may write inputted data to the sense component 245 and compare the inputted data and the stored data at the sense component 245. For example, a voltage of a digit line (e.g., data line) associated with the sense component 245 may change, where the change in voltage may satisfy (e.g., surpass) a threshold voltage to indicate a mismatch in data, and the sense component 245 may output a signal based on the voltage satisfying the threshold voltage. Based on the signal, the memory device 110 may output an indication (e.g., a flag) of whether the stored data and the inputted data match. In some cases, the change in voltage may be relatively small. Accordingly, the memory device 110 may utilize a current mirror to amplify current generated by the change in voltage to satisfy the threshold and thereby detect a mismatch. Additionally, or alternatively, the memory device 110 may utilize biasing circuitry to produce a condition (e.g., a fighting condition) at the sense amplifier upon a voltage change, which may hold current generation for a relatively longer period of time and create an amount of current that may satisfy the threshold.

Figure 3:
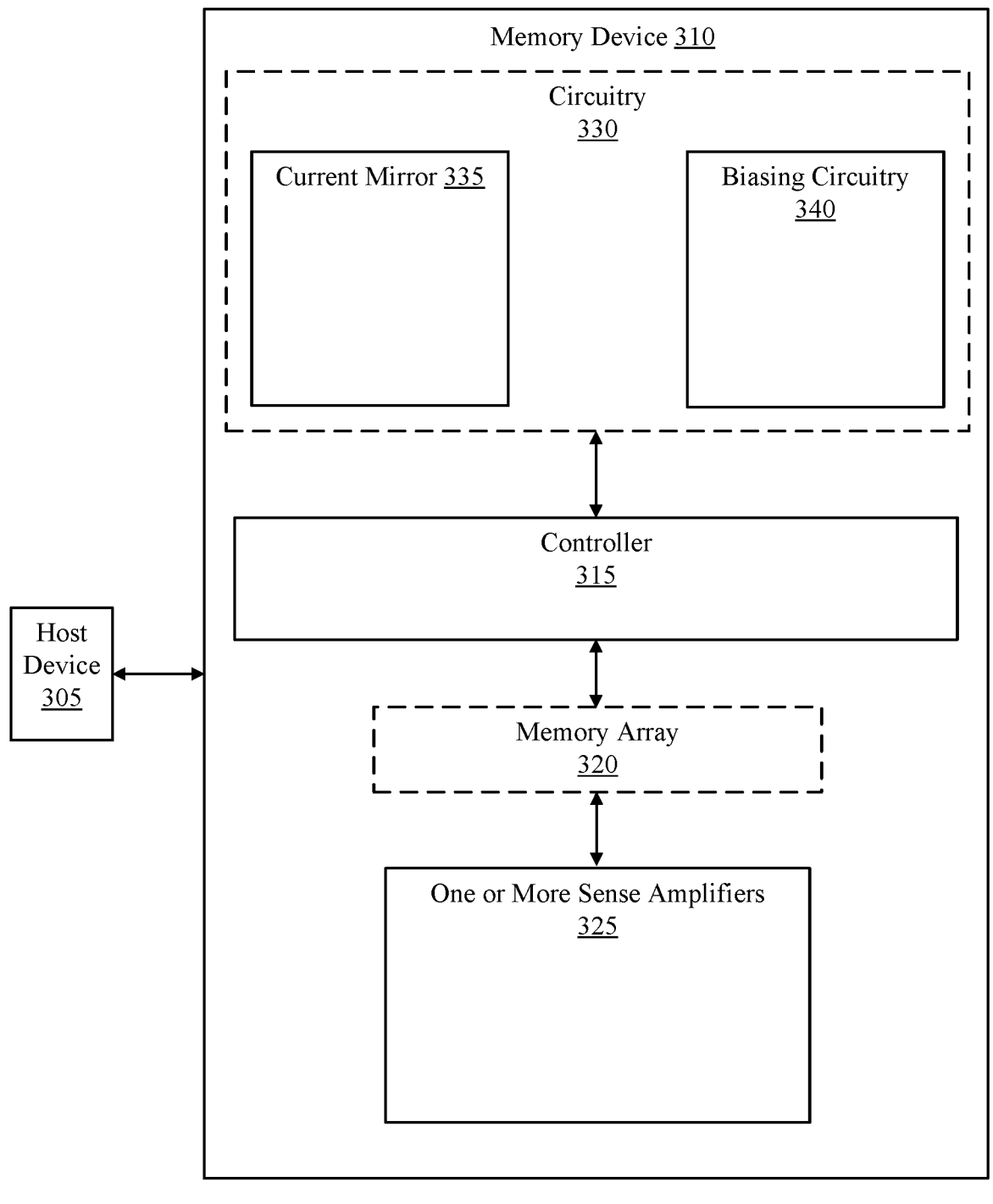
FIG. 3 illustrates an example of a system that supports non-destructive pattern identification at a memory device in accordance with examples as disclosed herein.

FIG. 3 illustrates an example of a system 300 that supports non-destructive pattern identification at a memory device in accordance with examples as disclosed herein. The system 300 may be an example of or implement aspects of a system 100 or a memory die 200 as described herein with reference to FIG. 1 and FIG. 2 respectively. For example, a memory device 310 and a host device 305 may be examples of the memory device 110 and the host device 105 and one or more sense amplifiers 325 may be examples of the sense component 245.

The system 300 may include a host device 305 and a memory device 310. The memory device 310 may include a controller 315, a memory array 320, one or more sense amplifiers 325, and circuitry 330, which may be examples of or implement aspects of components as described herein with reference to FIGS. 1 and 2. Although illustrated as separate for illustrative clarity, it is to be understood that the system 300 may include components that are combined, arranged in different locations or orientations, or a combination thereof. Additionally, or alternatively, the system 300 may have additional types or quantities of components, and/or some components may be absent from the system 300. In some examples, operations described as being included or performed at one component or system may additionally or alternatively be performed at another component or system.

The controller 315 may be an example of the memory controller 155 or the local memory controllers 165 as described with reference to FIG. 1, or an example of the local memory controller 260 as described with reference to FIG. 2. For example, the controller 315 may be operable to execute commands received from the host device 305, control the data path components in the moving of data, and the like, as described herein with reference to FIGS. 1 and 2.

The memory device 310 may additionally include a memory array 320, which may be an example of a memory array as described with reference to FIGS. 1 and 2. For example, the memory array 320 may be written to store data or stored data may be read from the memory array 320 in response to access commands from the host device 305. The memory array 320 may be an example of NAND memory, flash memory, PCM, self-selecting memory, 3D cross point, other chalcogenide-based memories, FERAM, MRAM, NOR (e.g., NOR flash) memory, STT-MRAM, CBRAM, RRAM, OxRAM, or any combination thereof, though any type or quantity of memory may be used.

The memory device 310 may include one or more sense amplifiers 325, which may be an example of a sense component 245 as described herein with reference to FIG. 2. For example, the one or more sense amplifiers 325 may be operable to detect a state (e.g., a charge) stored on a capacitor of one or more memory cells of the memory array 320. The one or more sense amplifiers 325 may be operable to latch the state stored by the memory cells and compare the latched state to another state. In some cases, the memory device 310 may write the another state to the one or more sense amplifiers 325 as part of a pattern identification procedure.

In the example of the system 300, the memory device may include circuitry 330. In some cases, the circuitry 330 may include a current mirror 335, a biasing circuitry 340, or both, as described herein with reference to FIGS. 5 and 6 respectively. For example, the current mirror 335 and the biasing circuitry 340 may include various electrical components such as transistors, resistors, capacitors, amplifiers, regulators, and the like. The various electrical components may be arranged in different locations or orientations to perform a same or similar operation to achieve a similar result. The current mirror 335 and the biasing circuitry 340 may enable the memory device 310 to detect a change in voltage associated with whether a first data pattern and a second data pattern match, as described herein with reference to FIGS. 1 and 2.

In some examples, the system 300 may perform various operations associated with pattern identification (e.g., pattern matching). For example, the system 300 may execute various algorithms associated with artificial intelligence, machine learning, neural networks, deep learning, and the like, which utilize pattern identification to refine decision making or "learn" how to come to a desired conclusion, among other uses (e.g., to give some recognition intelligence to machines in image processing). In some cases, an example of a pattern identification operation may include the host device 305 (e.g., an SoC) reading out data stored in the memory device 310 and comparing the data to a pattern one by one (e.g., bit by bit) to identity if the stored data is the same as the pattern. However, such pattern identification may result in a bottleneck of relatively high power consumption, low speed (e.g., high latency), corrupted data (e.g., due to reading out and comparing the data), or any combination thereof. In accordance with the techniques described herein, the system 300 may be operable to perform a pattern identification procedure at the memory device 310 and output a result of such procedures to the host device 305, which may result in increased speed, reduced power, or both.

For example, the memory device 310 may receive signaling that indicates a first data pattern and one or more addresses of memory cells within the memory array 320 of the memory device 310 (e.g., the host device 305 may transmit the signaling requesting a response of whether one or more of the indicated addresses are storing data that matches the first data pattern or fails to match the first data pattern). In some cases, the first data pattern may be inputted data from an outside source (e.g., the host device 305) on a data bus (e.g., DQ) and the one or more addresses may be associated with a second data pattern stored at the memory cells of the memory array 320. In some examples, a data pattern may be an example of a pattern of logic states (e.g., a series of 0s and 1s in a consecutive or configured order, quantity, and the like).

In some cases, the memory device 310 may latch the second data pattern to the one or more sense amplifiers 325. Latching data may include coupling the memory cells to respective sense amplifiers such that one or more components of the sense amplifiers have a voltage that indicates the state of the memory cell. For example, the memory device 310 may activate (e.g., fire) one or more word lines (e.g., open one page of data) associated with the one or more addresses, and latch (e.g., temporarily store) portions of the second data pattern that are associated with the activated word lines in each of the one or more sense amplifiers 325. The memory device 310 may then deactivate (e.g., turn off) the word lines (e.g., one-thousand and twenty-four word lines) after the portions of the second data pattern are latched by the one or more sense amplifiers 325. By turning off the word lines after latching the second data pattern, protection from data corruption (e.g., non-corrupted data) may increase, relative to the word lines being actively coupled to the one or more memory cells during pattern identification. For example, turning off the word lines may isolate the memory cells from subsequent operations at the sense amplifier, such as writing the first data pattern as part of the pattern identification, thus protecting the memory cells from having a state changed due to different voltages being applied from the sense amplifier through the word lines.

In some examples, the memory device 310 may write the first data pattern to the one or more sense amplifiers 325 after latching the second data pattern by the one or more sense amplifiers 325. For example, an outside entity (e.g., the host device 305) may write the first data pattern (e.g., an authentication data pattern) to a DQ bus and the memory device 310 may write the first data pattern from the DQ bus to the one or more sense amplifiers 325 after the word lines have been turned off and the memory array 320 decoupled from the one or more sense amplifiers 325.

After writing the first data pattern to the one or more sense amplifiers 325, a voltage of one or more digit lines (e.g., data lines) associated with the one or more sense amplifiers 325 may indicate whether the first data pattern matches with the second data pattern. In some cases, if the data patterns match, then the digit line voltage may remain unchanged (e.g., no toggle). If the data patterns mismatch, then the digit line voltage may change (e.g., toggle). For example, the digit line voltage may "flip" from a first voltage to a second voltage. Such a change in the digit line voltage may produce (e.g., generate) an associated current (e.g., a current of the array ($I_{ARY}$)). In some examples, such a current may be increased in magnitude, duration, or both (e.g., amplified by a factor of X), such that the current may satisfy or surpass a threshold as described herein (e.g., the current may be held at a condition or amplified by a current mirror). As an illustrative example, a sense amplifier of the one or more sense amplifiers 325 may include two digit lines, a DLT and a DLB. If the input data pattern (e.g., the first data pattern) matches the original data (e.g., the second data pattern) stored in the memory cells of the memory array 320, then the voltage of the DLT and the voltage of the DLB may remain the same. However, if the input data pattern fails to match the original data, then the voltage of the DLT may flip with the voltage of the DLB and current may flow on a power bus (e.g., $V_{ARY}$), indicating the flip (e.g., from high to low) and associated mismatch of data, as described herein with reference to FIGS. 5 and 7.

In some cases, the memory device 310 may output an indication of whether the first data pattern matches the second data pattern based on the current (e.g., the current generated by the digit line flip). For example, when the current is sufficient to satisfy the threshold (e.g., large enough to pull $V_{ARY}$ from high to low (1 to 0) or from low to high) the memory device 310 may output a flag (e.g., a logic value of one) that indicates a mismatch (e.g., a failure to match) between the first data pattern and the second data pattern. When the current is insufficient to satisfy the threshold the memory device 310 may output a flag (e.g., a logic value of zero) that indicates a match between the first data pattern and the second data pattern. For example, if the digit line fails to flip due to the latched data pattern (e.g., state of one or more memory cells) matching the written data pattern, no current or a current that fails to satisfy a threshold (e.g., a current too small to flip $V_{ARY}$) may be generated based on the matching data.

Figure 4:
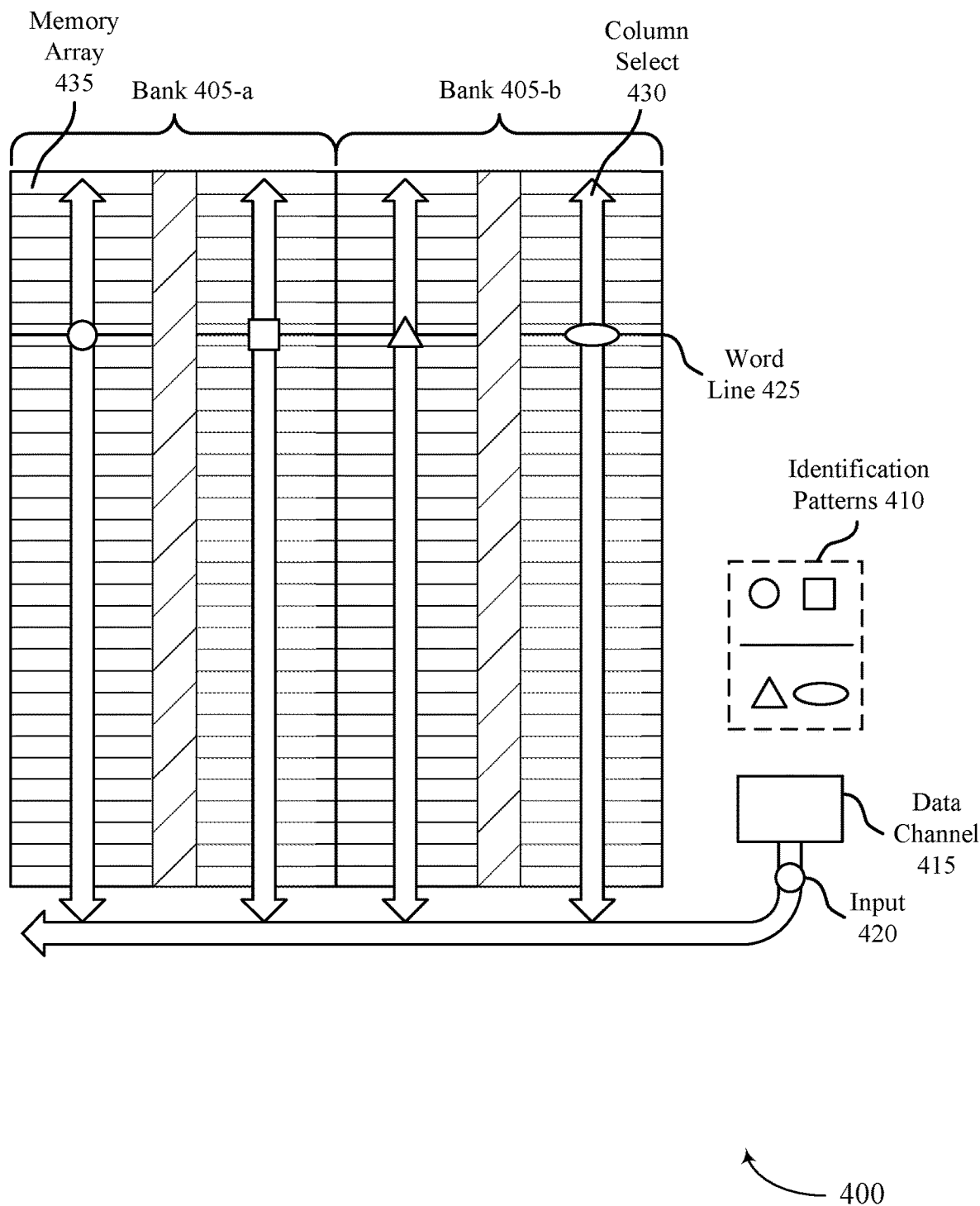
FIG. 4 illustrates an example of a system that supports non-destructive pattern identification at a memory device in accordance with examples as disclosed herein.

FIG. 4 illustrates an example of a system 400 that supports non-destructive pattern identification at a memory device in accordance with examples as disclosed herein. The system 400 may be an example of or implement aspects of a system 100, 300, or a memory die 200, as described herein with reference to FIGS. 1-3. For example, a bank 405-a and a bank 405-b may include or be included in one or memory arrays (e.g., memory arrays 170 or memory array 320) and a word line 425 may be examples of the word lines 210.

The system 400 may include one or more banks of memory (e.g., the bank 405-a and the bank 405-b), one or more memory arrays 435 associated with the banks 405, one or more column selects 430 (e.g., a column select 430 per memory array 435; a column select 430 may in some cases be alternatively referred to as a column select line), a word line 425, and a data channel 415 (e.g., a data bus DQ), which may be examples of or implement aspects of components as described herein with reference to FIGS. 1 through 3.

In some cases, the system 400 may perform various operations associated with pattern identification. For example, a host device 105 may input one or more identification patterns 410 to the data channel 415. A memory device 110 may activate the word line 425 that is coupled, for example, to the bank 405-a and the bank 405-b and latch stored data. For example, the memory device 110 may activate the word line 425, which may open one page of data, and activate the column select 430 of a first memory array 435 of the bank 405-b at an initial column index (e.g., column zero). The memory device 110 may then latch the data stored at the intersection of the column select 430 and the word line 425 to a sense amplifier. The memory device 110 may increase the column select 430 to a subsequent column index (e.g., column one) and continue latching the data stored at the intersection until the column select 430 moves to the last column index (e.g., column sixty-three), which may result in the memory device 110 checking the data pattern stored within the first memory array 435 (e.g., a whole 8K page, where one column select index may access four or eight digit lines). In some cases, the memory device 110 may repeat this process for each memory array 435 associated with each bank 405 of the memory device 110.

In some examples, the repeated process may include multiple word lines 425. For example, the memory device 110 may activate multiple word lines 425 (e.g., a first word line 425 at row index i, a second word line at row index i+n, etc.) associated with the bank 405-a, the bank 405-b, or both. The memory device 110 may then activate, latch, and deactivate as described herein, at each intersection of the column select 430 and the multiple word lines 425. In some cases, the memory device 110 may increase the column select 430 such that each column of the memory array 435 is activated and then step (e.g., increase) the multiple word lines 425 concurrently to repeat the process, until each row and each column of the memory array 435 has been activated. In some cases, the memory device 110 may increase the multiple word lines 425 concurrently such that each row of the memory array 435 is activated and then step the column select 430 to repeat the process, until each row and each column of the memory array 435 has been activated.

In some examples, the bank 405-a may store data of a different pattern from bank 405-b. The memory device 110 may latch the data stored at each bank 405 to separate one or more sense amplifiers and turn off the word line 425 (e.g., disable a $V_{ARY}$ regulator per bank 405) to preserve the data stored at each memory array 435. After turning off the word line 425, the memory device 110 may compare the data at each sense amplifier to the input 420. In some cases, the memory device 110 may perform simultaneous or parallel comparisons at each sense amplifier. In some cases, the memory device 110 may compare the input 420 to each sense amplifier individually. Additionally, or alternatively, the memory device 110 may include a single memory array 435 and may compare the input 420 to one or more sense amplifiers associated with the memory array 435 concurrently or individually (e.g., one by one). As an illustrative example, comparing the input 420 of one or more identification patterns 410 to the data latched from the memory array 435 may include writing the input 420 to the sense amplifiers, where a digit line voltage or associated current may change or remain the same based on whether the identification pattern of the input 420 matches or fails to match the data read from the bank(s) 405.

In some cases, each memory array 435 may have a separate indicator (e.g., a flag) associated with the memory array 435 (e.g., flag0, flag1, etc.), that indicates whether the data stored at the memory array 435 matches the input 420. Based on the comparison, the memory device 110 may generate one or more signals indicating, for each bank 405, whether at least a respective portion of the input 420 matches a respective portion of the stored data. For example, the input 420 may include a first data pattern (e.g., a series of bits or data represented by a circle). The memory device 110 may activate the word line 425, cycle the column select 430 for each column of the memory array 435, latch each bit of data stored at the intersection of the word line 425 and the column select 430, and compare the stored data to the input 420. In some cases, the stored data may include a second data pattern e.g., a series of bits or data represented by an oval). The memory device 110 may write a respective portion of the input 420 (e.g., the circle) to sense amplifiers storing a respective portion of the latched data (e.g., the oval) and compare the respective portions. In some examples, one or more of the sense amplifiers may output an indication of a match (e.g., the logic state of the memory cell matches the logic state at that position of the data pattern) while other sense amplifiers may output an indication of a mismatch (e.g., the logic state of the memory cell fails to match a logic state at that position of the data pattern). In some examples, if even one sense amplifier indicates a mismatch (e.g., one bit digit line toggles), the memory device 110 may output an indication that the first data pattern fails to match the second data pattern, as described herein with reference to FIGS. 5 and 6.

In some cases, the stored data may include the second data pattern represented by the circle. The memory device 110 may write the respective portion of the input 420 (e.g., the circle) to sense amplifiers storing a respective portion of the latched data (e.g., the circle) and compare the respective portions. Because the first data pattern is a circle and the second data pattern is the same circle, each sense amplifier may output an indication of a match and the memory device 110 may output an indication that the first data pattern matches with the second data pattern.

Figure 5:
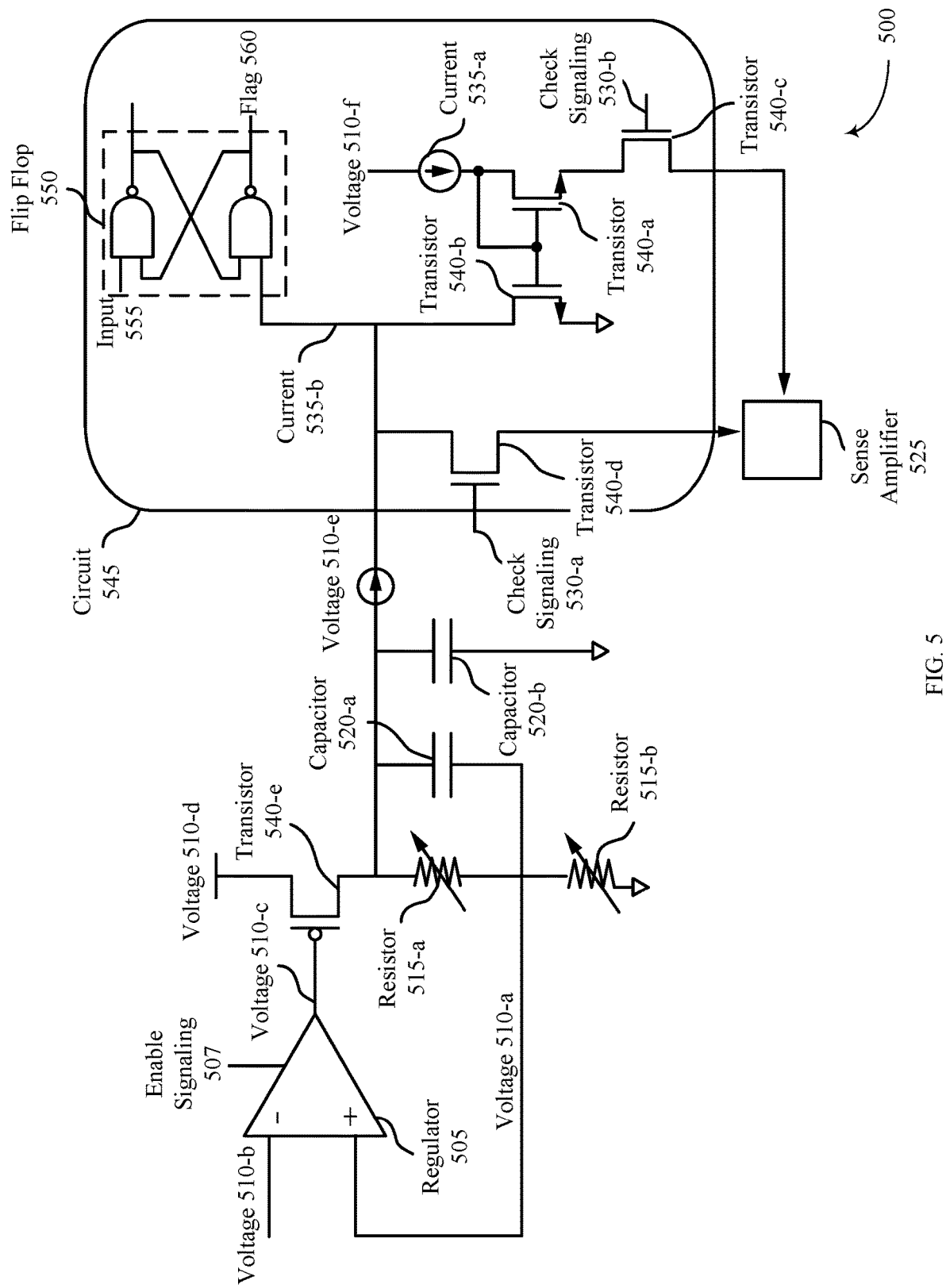
FIG. 5 illustrates an example of a circuit that supports non-destructive pattern identification at a memory device in accordance with examples as disclosed herein.

FIG. 5 illustrates an example of a circuit 500 that supports non-destructive pattern identification at a memory device in accordance with examples as disclosed herein. The circuit 500 may be an example of or implement aspects of a system 100, 300, 400, or a memory die 200, as described herein with reference to FIGS. 1-4. For example, a sense amplifier 525 may be an example of one or more sense amplifiers 325.

The circuit 500 may include multiple components such as a regulator 505, one or more resistors 515 (e.g., a resistor 515-a and a resistor 515-b), one or more capacitors 520 (e.g., a capacitor 520-a and a capacitor 520-b), a sense amplifier 525, one or more check signaling 530 (e.g., check signaling 530-a and check signaling 530-b), one or more transistors 540 (e.g., a transistor 540-a, a transistor 540-b, transistor 540-c, a transistor 540-d, and a transistor 540-e), a circuit 545 (e.g., a pnsaq), sequential logic (e.g., a flip flop 550), input 555 to the flip flop 550, a flag 560 (e.g., output from the flip flop 550), various wires connecting the multiple components, and various voltages 510 and currents 535 across the various wires. The multiple components may be examples of or implement aspects of components as described herein with reference to FIGS. 1-4. Although illustrated as separate for illustrative clarity, it is to be understood that the circuit 500 may include components that are combined, arranged in different locations or orientations, or a combination thereof. Additionally, or alternatively, the circuit 500 may have additional types or quantities of components, and/or some components may be absent from the circuit 500. In some examples, operations described as being included or performed at one component or system may additionally or alternatively be performed at another component or system. In some examples, signaling may be an example of a voltage or current between two components.

As described herein with reference to FIGS. 3 and 4, a memory device 110 may activate one or more word lines. For example, the regulator 505 may receive an enable signaling 507. The regulator 505 may receive an input voltage 510-b (e.g., $V_{ref}$) and an input voltage 510-a (e.g., $V_{fb}$) and output a voltage 510-c (e.g., $V_{out}$) to the transistor 540-e based on the enable signaling 507. A voltage 510-d (e.g., $V_{DD}$) may run across the transistor 540-e based on the voltage 510-c and, where the transistor 540-e may be coupled to the resistor 515-a, the resistor 515-b (e.g., variable resistors), the capacitor 520-a (e.g., a miller capacitor), and the capacitor 520-b (e.g., a decoupling capacitor).

The voltage 510-e (e.g., $V_{ARY}$) may become high (e.g., be indicative of a logic state one) based on the enable signaling 507 and the voltage 510-d.

In some cases, the memory device 110 may latch data stored at one or more memory cells to the sense amplifier 525, as described herein with reference to FIGS. 1-4. For example, sense amplifier 525 may be connected to the circuit 500 via one or more nodes. The sense amplifier 525 may latch the stored data (e.g., the data stored in the one or more memory cells) and the memory device 110 may turn off the regulator 505 (e.g., the $V_{ARY}$ regulator), which may preserve the data stored at the memory cells (e.g., avoid destruction of logic states) by isolating the memory cells from the sense amplifier 525. In some examples, the check signaling 530-a may be input to the transistor 540-d and couple or decouple the circuit 500 to the node of the sense amplifier.

In some examples, after the memory device 110 turns off the regulator 505, the memory device may write, to the sense amplifier 525, input data (e.g., input 420). For example, the circuit 545 may receive the check signaling 530-a at the transistor 540-c. In some cases, the voltage 510-f (e.g., $V_{CC}$) of a digit line associated with the sense amplifier may change, which may result in the voltage 510-e being pulled down (e.g., from a logic state one to a logic state zero) and indicate a mismatch between the latched data and the received data at the sense amplifier 525. For example, based on the mismatch, the circuit 545 may produce the current 535-a, which may result in the voltage 510-e being pulled down.

However, in some examples, the current 535-a may be relatively small (e.g., the current 535-a may be indicative of a single bit mismatch). Because the current 535-a may be insufficient to pull the voltage 510-e down (e.g., insufficient to satisfy a threshold due to being relatively small), the memory device 110 may generate an amplified current using a current mirror coupled to the sense amplifier 525. For example, the circuit 545 may amplify the current 535-a (e.g., the probed sense amplifier 525 current) by utilizing the current mirror (e.g., the transistor 540-b). The amplified current 535-b (e.g., the product of the amplification X and the current 535-a) may then pull down the voltage 510-e, which is input to the flip flop 550, along with the input 555 (e.g., RstF), which may result in the flip flop 550 outputting the flag 560 indicating a mismatch or a match of data patterns. In some cases, the amplified current 535-b pulling down the voltage 510-e may change a default value (e.g., a logic state zero) of the flag 560 that indicates a match, to another output (e.g., a logic state one) that indicates a mismatch (e.g., a failure to match). As an illustrative example, if the logic state latched at the sense amplifier 525 differs from the logic state written to the sense amplifier (e.g., a bit of a pattern), then the voltage 510-e input to the flip flop 550 may change from 1 to 0, causing the flag to change from 0 to 1 and thus indicating a mismatch. As another example, if the latched logic state matches the logic state written to the sense amplifier, the voltage 510-e may not change states and the flag 560 may maintain a value of 0, indicating a match between the logic states.

Figure 6A:
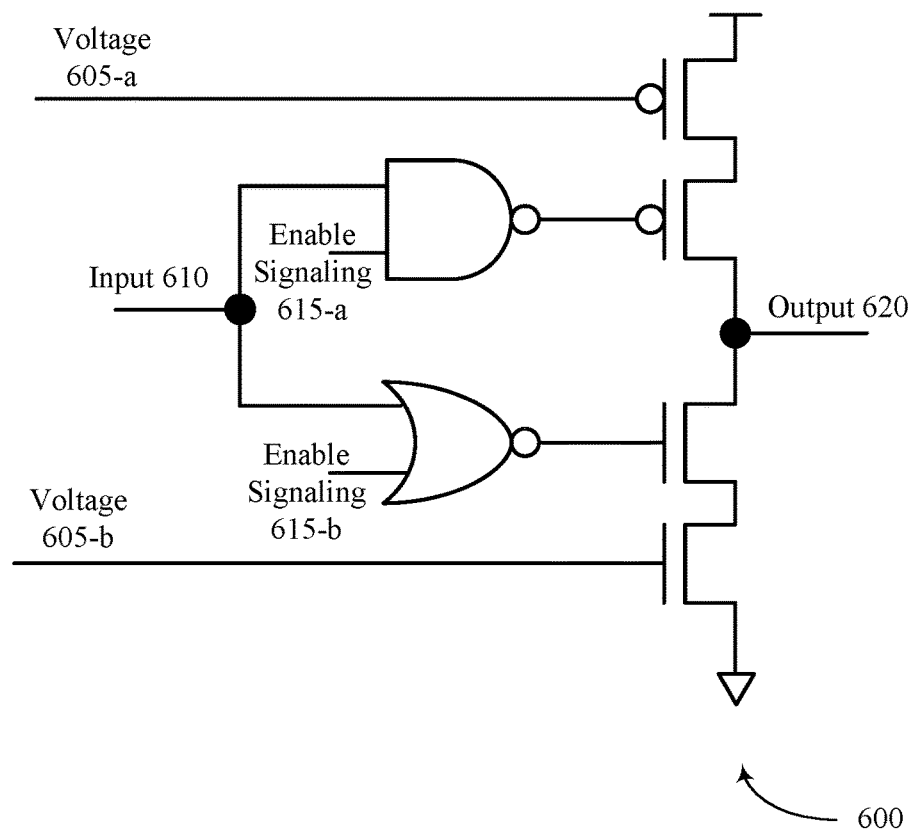
FIG. 6A illustrates an example of a circuit that supports non-destructive pattern identification at a memory device in accordance with examples as disclosed herein.
Figure 6B:
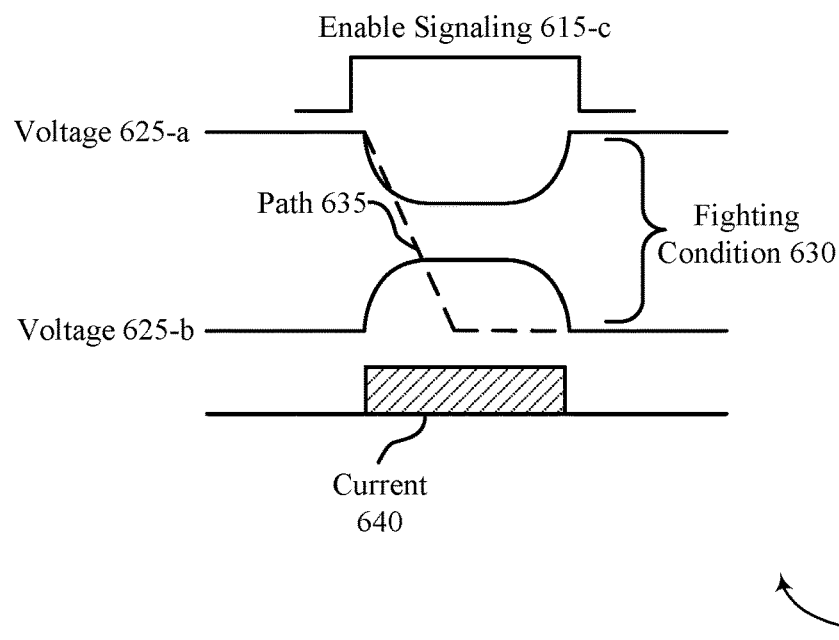
FIG. 6B illustrates an example of signaling that supports non-destructive pattern identification at a memory device in accordance with examples as disclosed herein.

FIG. 6A illustrates an example of a circuit 600 and FIG. 6B illustrates an example of signaling 602 that both support non-destructive pattern identification at a memory device in accordance with examples as disclosed herein. The circuit 600 may be an example of or implement aspects of a system 100, 300, 400, a memory die 200, or a circuit 500, as described herein with reference to FIGS. 1-5. The circuit 600 may include biasing circuitry that includes multiple components such as, one or more transistors (e.g., one or more bias gates) and one or more logic circuits (e.g., a NAND and a NOR), and various wires connecting the multiple components. The multiple components may be examples of or implement aspects of components as described herein with reference to FIGS. 1-5. Although illustrated as separate for illustrative clarity, it is to be understood that the circuit 600 may include components that are combined, arranged in different locations or orientations, or a combination thereof. Additionally, or alternatively, the circuit 600 may have additional types or quantities of components, and/or some components may be absent from the circuit 600. In some examples, operations described as being included or performed at one component or system may additionally or alternatively be performed at another component or system.

In some examples, a memory device 110 may activate one or more word lines. For example, the memory device 110 may activate a regulator (e.g., a $V_{ARY}$ regulator), as described herein with reference to FIG. 5, which may result in the circuit 600 receiving a voltage 605-a and a voltage 605-b. The regulator may supply power (e.g., current) to one or more sense amplifiers to latch a second data pattern associated with the word lines prior to the memory device 110 deactivating the word lines. In some cases, a host device 105 may write, to the sense amplifiers, a first data pattern and the circuit 600 may receive the first data pattern (e.g., input 610). After the memory device 110 deactivates the one or more word lines, the memory device 110 may transmit, to the circuit 600, enable signaling 615-a and enable signaling 615-b. The memory device 110 may compare the first data pattern to the second data pattern (e.g., stored data) at the sense amplifiers and output whether the first data pattern matches the second data pattern.

As an illustrative example, the signaling 602 may indicate various voltages and currents associated with detecting a mismatch. As an example of matching data, the voltage 625-a and the voltage 625-b may maintain a level and thus produce no current or a current 640 small enough to fail to satisfy a threshold, indicating that the data matches. Additionally or alternatively, as an illustrative example of a mismatch without the biasing circuitry of the circuit 600, the voltage 625-a may follow a path 635 based on the mismatch between data latched at a sense amplifier and data written to the sense amplifier as described herein. For example, the voltage 625-a of the digit line may go from high (e.g., logic 1) to low (e.g., logic 0). Additionally or alternatively, the voltage 625-b may go from low to high. However, the path 635 may occur relatively quickly. For example, due to the path 635 arriving at the low state relatively quickly, the current 640 generated by the change in voltage may be relatively small. Thus, the mismatch may not generate enough current to flip Vary and indicate a mismatch as described herein. Accordingly, the circuitry 600 (e.g., biasing circuitry) may create a fighting condition 630, which may extend the duration of the voltage change of the voltages 625, which may result in a higher amount of current 640 (e.g., enough current to detect a mismatch without a current mirror). Stated alternatively, the circuit 600 (e.g., the biasing circuit) may provide for a voltage 625-a (e.g., DLT) of the sense amplifiers and a voltage 625-b (e.g., DLB) of the sense amplifiers to be in a power state (e.g., a fighting condition 630) that promotes increased current 640.

In some cases, the memory device 110 may bias a data line operable to couple with the sense amplifiers based on the enable signaling 615-a and enable signaling 615-b, where a current associated with writing the first data pattern is increased in magnitude, duration, or both, based on biasing the data line. For example, the circuit 600 may apply a first bias (e.g., the voltage 605-a) based on a first trim parameter and a second bias (e.g., the voltage 605-b) based on a second trim parameter, where the trim parameters may be trimmable to adjust for an appropriate driver strength to result in the fighting condition 630. A trim parameter may be an example of a parameter configured at the memory device 110 and used to set various voltages and other configuration parameters. In some examples, the trim parameters may be adjustable (e.g., trimmable), for example, during a test mode of the memory device 110 and thus able to be tweaked per memory device 110 to create the fighting condition 630 (e.g., too weak of a bias may result in insufficient current 640, while too strong of a bias may reduce the voltage change in the voltages 625 and also result in insufficient current 640, and the parameters may be adjusted to result in a bias that maintains the fighting condition 630 to generate the current 640).

For example, the first trim parameter and the second trim parameter may result in the voltage 605-a and the voltage 605-b (e.g., a positive bias (pbias) and a negative bias (nbias), respectively) being in a power state (e.g., a weak 'on' state). The voltage 605-a may be applied to bias the gate of a PMOS transistor, and the voltage 605-b may be applied to bias the gate of an NMOS transistor as shown in the example of FIG. 6A. In some cases, the weak 'on' state may result in the sense amplifiers being stuck at the fighting condition 630, thereby generating the current 640 that may satisfy a threshold to indicate the mismatch. The voltage 625-a associated with the first data pattern and the voltage 625-b associated with the second data pattern may enter into the fighting condition 630 (e.g., during a mismatch) based on the first and second bias. In some cases, the fighting condition 630 may prolong a duration during which the current 640 may be produced, or a magnitude of the current 640, or both. Thus, the current 640 may be sufficient to satisfy the threshold (e.g., the current 640 is detectable by the memory device 110) and the memory device 110 may output an output 620 (e.g., a flag) indicating to the host device 105 that the first data pattern fails to match the second data pattern.

Figure 7:
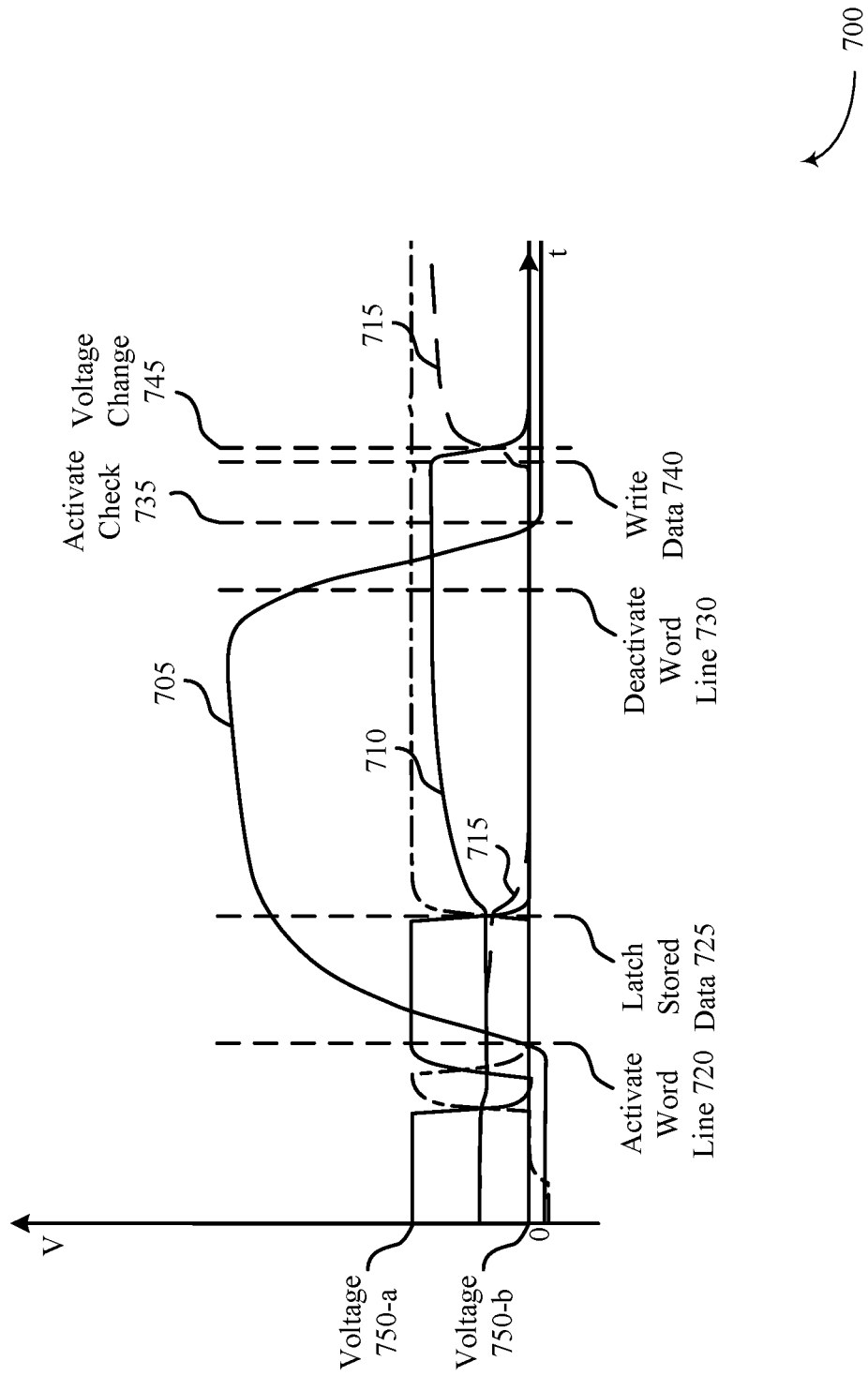
FIG. 7 illustrates an example of a timeline that supports non-destructive pattern identification at a memory device in accordance with examples as disclosed herein.

FIG. 7 illustrates an example of a timeline 700 that supports non-destructive pattern identification at a memory device in accordance with examples as disclosed herein. The timeline 700 may implement aspects of a system 100, 300, 400, a memory die 200, a circuit 500, or a circuit 600, as described herein with reference to FIGS. 1-6. The timeline 700 may include a y-axis associated with voltage, an x-axis associated with time, a word line 705, a first digit line 710 (e.g., DLT), and a second digit line 715 (e.g., DLB). Although illustrated according to events and waveforms along a voltage by time axis, it is to be understood that the timeline 700 may include events or waveforms arranged in different periods or orientations. Additionally, or alternatively, the timeline 700 may have additional events or waveforms, and/or some events or waveforms may be absent from the timeline 700. In some examples, operations described as being included or performed at one time may additionally or alternatively be performed at another time.

In some examples, at 720, a memory device 110 may activate the word line 705, as described herein with reference to FIGS. 1-6. At 725, the memory device 110 may latch a second data pattern associated with one or more addresses of the activated word line 705 to one or more sense amplifiers. In some cases, the first digit line 710 and the second digit line 715 may be inversely correlated (e.g., reflect each other) at the one or more sense amplifiers. After latching the second data pattern to the sense amplifiers, the first digit line 710 may approach a voltage 750-a (e.g., go high) and the second digit line 715 may conversely approach a voltage 750-*b* (e.g., go low). At 730, the memory device 110 may deactivate the word line 705 (e.g., after each memory cell of a memory array has been latched to the one or more sense amplifiers) to protect the memory cells from data corruption.

At 735, the memory device 110 may activate a check signal (e.g., check signaling 530, enable signaling 615, etc.), such that the one or more sense amplifiers may be written to. At 740, the memory device 110 may write at least a portion of a first data pattern received from a host device 105 (e.g., via DQ channel) to the sense amplifiers. In some cases, the portion of the first data pattern may match a respective portion of the second data pattern at the sense amplifiers. For example, the first data pattern may be a circle and the second data pattern may be the same circle. In such cases, the first digit line 710 may remain relatively unchanged (e.g., stay close to the voltage 750-*a*). In some examples, the portion of the first data pattern may mismatch (e.g., fail to match) the respective portion of the second data pattern at the sense amplifiers. For example, the first data pattern may be a circle and the second data pattern may be an oval. In such cases, at 745, the first digit line 710 may approach the voltage 750-*b* (e.g., toggle, flip, change, etc.) and the second digit line 715 may conversely approach the voltage 750-*a*.

In some examples, the memory device 110 may output an indication of whether the first data pattern matches the second data pattern based on the voltage change at 745. For example, the voltage flip of the first digit line 710 and the second digit line 715 during a mismatch may produce current sufficient to cause a voltage associated with input to a sequential logic (e.g., a flip flop 550) to flip (e.g., from high to low), which may result in the sequential logic outputting a logic state different than a default logic state (e.g., from a zero to a one). In some cases, the logic state output (e.g., the indication) may be an example of a flag 810, as described herein with reference to FIG. 8.

In some examples, the voltage flip may represent an example of a single bit flip (e.g., a mismatch of a single bit between the first data pattern and the second data pattern). In some cases, the change of the voltage of the first digit line 710 may be produce insufficient current to cause the voltage associated with the input to the sequential logic to flip. However, the memory device may implement a current mirror, biasing circuitry, or both, to amplify the current, increase a magnitude of the current, increase a duration of production of the current, or any combination thereof, such that the current may satisfy the threshold associated with flipping the voltage associated with the input to the sequential logic, as described herein with reference to FIGS. 5 and 6.

Figure 8:
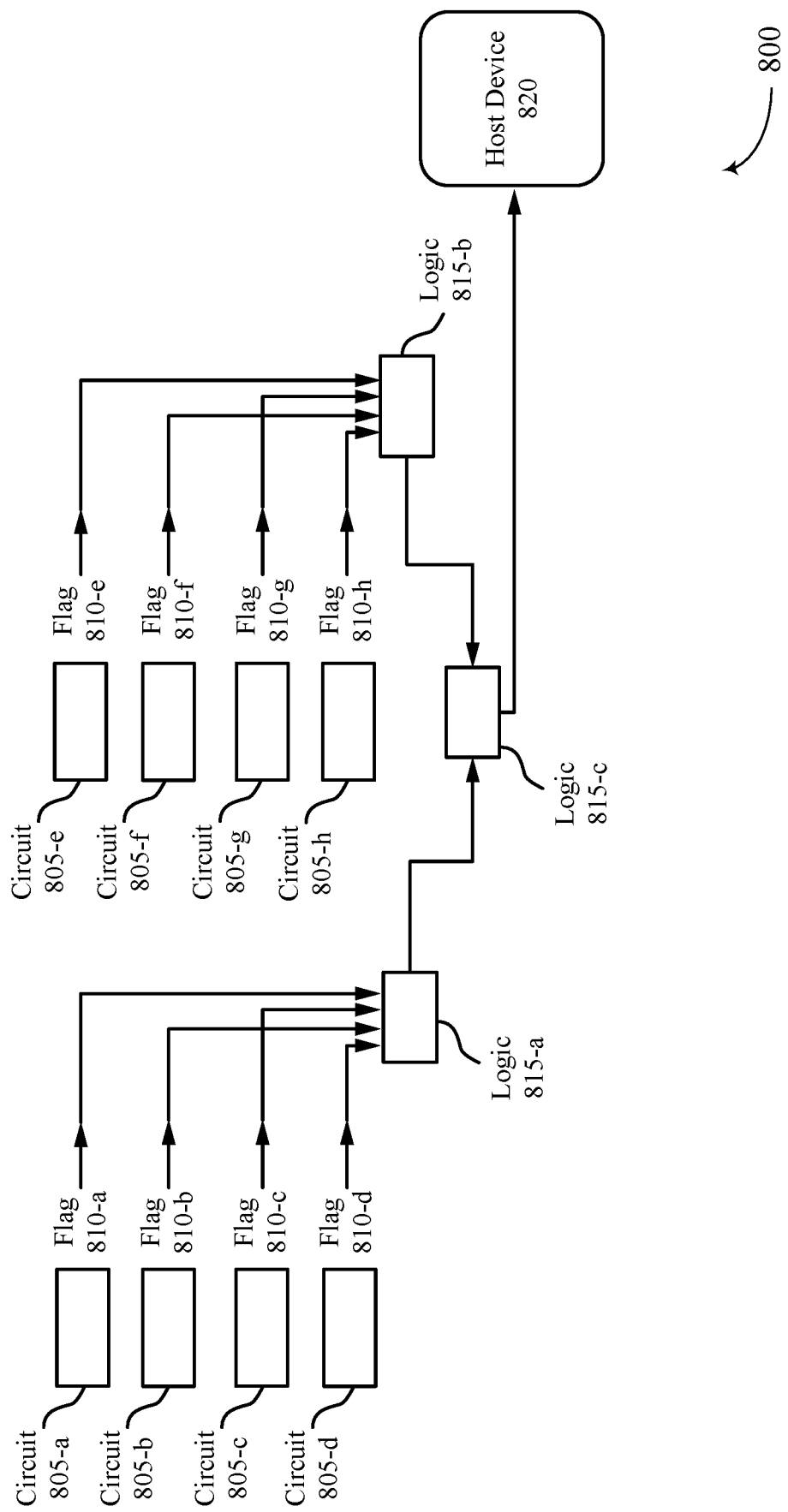
FIG. 8 illustrates an example of a system that supports non-destructive pattern identification at a memory device in accordance with examples as disclosed herein.

FIG. 8 illustrates an example of a system 800 that supports non-destructive pattern identification at a memory device in accordance with examples as disclosed herein. The system 800 may implement aspects of a system 100, 300, 400, a memory die 200, a circuit 500, 600, or a timeline 700, as described herein with reference to FIGS. 1-7. The system 800 may include multiple components such as, multiple circuits 805 (e.g., circuits 805-*a*, 805-*b*, 805-*c*, 805-*d*, 805-*e*, 805-*f*, 805-*g*, and 805-*h*) that may output flags 810 (e.g., flags 810-*a*, 810-*b*, 810-*c*, 810-*d*, 810-*e*, 810-*f*, 810-*g*, and 810-*h*), multiple logic circuits 815 (e.g., logic circuits 815-*a*, 815-*b*, and 815-*c*), and a host device 820. The multiple components may be examples of or implement aspects of components as described herein with reference to FIGS. 1-7. For example, the multiple circuits 805 may be examples of the circuit 500 or the circuit 600 and the host device 820 may be an example of a host device 105. In some cases, the logic circuit 815-*a* may be associated with a first bank of data (e.g., bank 405-*a*) and the logic circuit 815-*b* may be associated with a second bank of data (e.g., bank 405-*b*).

Although illustrated as separate for illustrative clarity, it is to be understood that the system 800 may include components that are combined, arranged in different locations or orientations, or a combination thereof. Additionally, or alternatively, the system 800 may have additional types or quantities of components, and/or some components may be absent from the system 800. In some examples, operations described as being included or performed at one component or system may additionally or alternatively be performed at another component or system.

In some cases, the multiple circuits 805 may perform various operations associated with pattern identification, as described herein with reference to FIGS. 1-7. For example, the multiple circuits 805 may output multiple flags 810, indicating whether a first data pattern matches a second data pattern. In some cases, each of the multiple circuits 805 may be associated with a respective portion of the first data pattern and a respective portion of the second data pattern, such that the memory device 110 may perform pattern identification concurrently (e.g., at multiple sense amplifier slices (pnsaq) parallelly). If each of the multiple flags 810 associated with each of the multiple circuits 805 include a same first logic state (e.g., a zero), then the memory device 110 may indicate to the host device 820 that the first data pattern matches the second data pattern. If any of the multiple flags 810 include a second logic state (e.g., a one), then the memory device 110 may indicate to the host device 820 that the first data pattern fails to match the second data pattern.

For example, the memory device 110 may indicate to the host device 820 that the first data pattern fails to match the second data pattern. In one such example, the circuits 805-*a*, 805-*b*, 805-*c*, 805-*d*, 805-*e*, 805-*f*, and 805-*g* may output flags 810-*a*, 810-*b*, 810-*c*, 810-*d*, 810-*e*, 810-*f*, and 810-*g* respectively that include a first logic state that indicates a match. The circuit 805-*h* may output a flag 810-*h* that includes a second logic state that indicates a mismatch. The logic circuit 815-*a* (e.g., a NAND) may receive the flags 810-*a*, 810-*b*, 810-*c*, and 810-*d* and output an indication of a match (e.g., a zero) or a mismatch. The logic circuit 815-*b* (e.g., a NAND) may receive the flags 810-*e*, 810-*f*, 810-*g*, and 810-*h* and output an indication of a mismatch (e.g., a one) based on the flag 810-*h*. The logic circuit 815-*c* (e.g., OR) may receive the output of the logic circuit 815-*a* and the logic circuit 815-*b* and output, to the host device 820, an indication of a mismatch (e.g., a one) based on the output of the logic circuit 815-*b*. In some cases, the host device 820 (e.g., an SoC) may be capable of determining the position of the circuits 805 (e.g., hit pnsaq) based on a reverse binary search.

Figure 9:
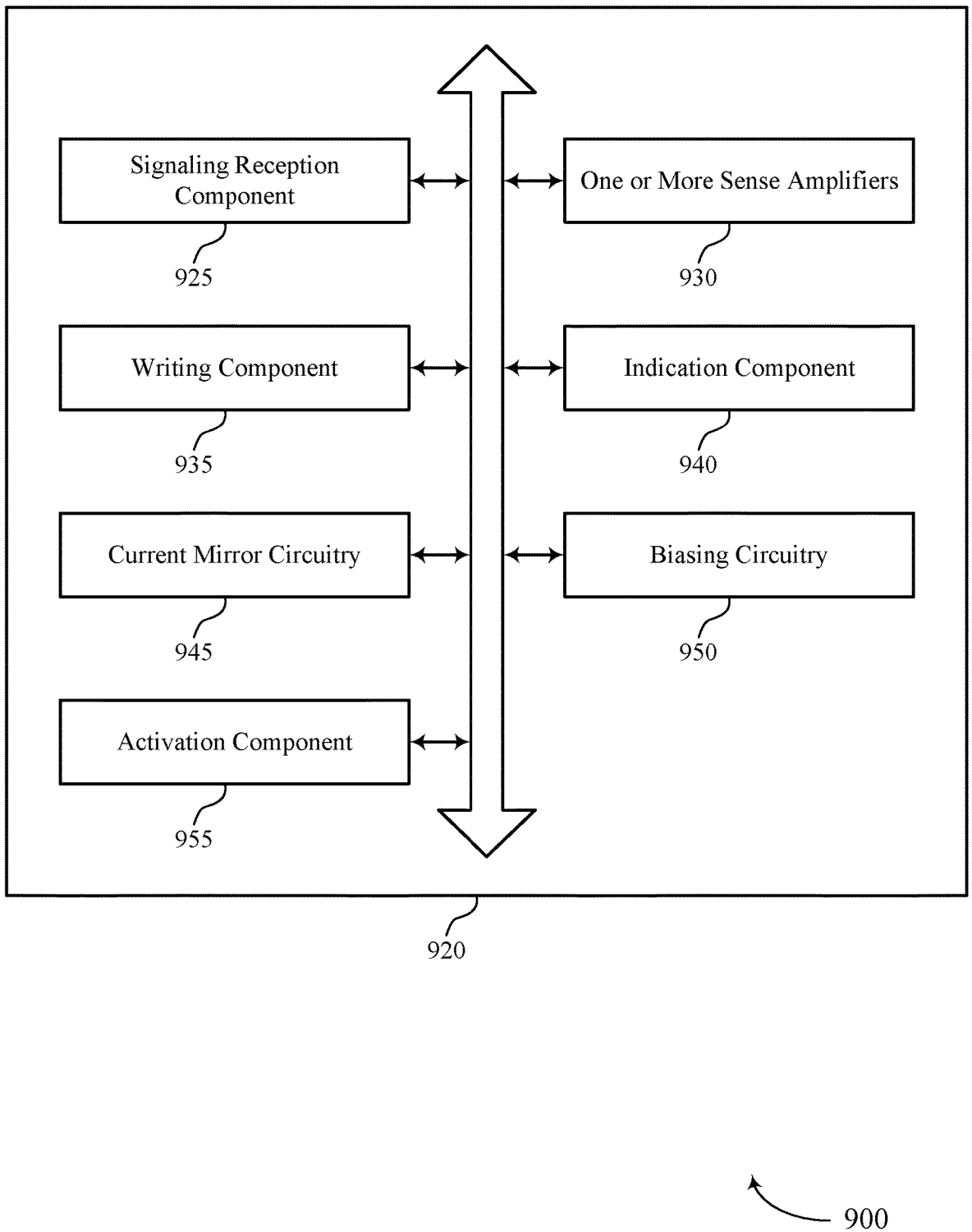
FIG. 9 shows a block diagram of a memory device that supports non-destructive pattern identification at a memory device in accordance with examples as disclosed herein.

FIG. 9 shows a block diagram 900 of a memory device 920 that supports non-destructive pattern identification at a memory device in accordance with examples as disclosed herein. The memory device 920 may be an example of aspects of a memory device as described with reference to FIGS. 1 through 8. The memory device 920, or various components thereof, may be an example of means for performing various aspects of non-destructive pattern identification at a memory device as described herein. For example, the memory device 920 may include a signaling reception component 925, a one or more sense amplifiers 930, a writing component 935, an indication component 940, a current mirror circuitry 945, a biasing circuitry 950, an activation component 955, or any combination thereof.

Each of these components may communicate, directly or indirectly, with one another (e.g., via one or more buses).

The signaling reception component 925 may be configured as or otherwise support a means for receiving, at a memory device, signaling that indicates a first data pattern and one or more addresses of memory cells within a memory device. The one or more sense amplifiers 930 may be configured as or otherwise support a means for latching a second data pattern associated with the one or more addresses by one or more sense amplifiers based at least in part on receiving the signaling. The writing component 935 may be configured as or otherwise support a means for writing, by the memory device, the first data pattern to the one or more sense amplifiers after latching the second data pattern by the one or more sense amplifiers. The indication component 940 may be configured as or otherwise support a means for outputting, by the memory device, an indication of whether the first data pattern matches the second data pattern based at least in part on writing the first data pattern to the one or more sense amplifiers.

In some examples, to support outputting the indication, the indication component 940 may be configured as or otherwise support a means for outputting an indication that the first data pattern fails to match the second data pattern based at least in part on a current associated with writing the first data pattern failing to satisfy a threshold.

In some examples, to support outputting the indication, the indication component 940 may be configured as or otherwise support a means for outputting an indication that the first data pattern matches the second data pattern based at least in part on a current associated with writing the first data pattern satisfying a threshold.

In some examples, the current mirror circuitry 945 may be configured as or otherwise support a means for generating an amplified current using a current mirror coupled to the one or more sense amplifiers and based at least in part on a current associated with writing the first data pattern, where the indication of whether the first data pattern matches the second data pattern is based at least in part on whether the amplified current satisfies a threshold.

In some examples, the biasing circuitry 950 may be configured as or otherwise support a means for biasing a data line operable to couple with the one or more sense amplifiers, where a current associated with writing the first data pattern is increased in magnitude, duration, or both based at least in part on biasing the data line, and where the indication of whether the first data pattern matches the second data pattern is based at least in part on whether the current satisfies a threshold.

In some examples, to support biasing the data line, the biasing circuitry 950 may be configured as or otherwise support a means for applying a first bias based at least in part on a first trim parameter stored in the memory device. In some examples, to support biasing the data line, the biasing circuitry 950 may be configured as or otherwise support a means for applying a second bias based at least in part on a second trim parameter stored in the memory device.

In some examples, the activation component 955 may be configured as or otherwise support a means for activating a word line coupled to a plurality of banks of a memory array within the memory device, where latching the second data pattern is based at least in part on activating the word line. In some examples, the indication component 940 may be configured as or otherwise support a means for generating a plurality of signals indicating, for each bank of the plurality of banks, whether at least a respective portion of the first data pattern matches at least a respective portion of the second data pattern, where the indication of whether the first data pattern matches the second data pattern is based at least in part on inputting the plurality of signals.

In some examples, to support outputting the indication, the indication component 940 may be configured as or otherwise support a means for outputting an indication that the first data pattern matches the second data pattern based at least in part on each of the plurality of signals indicating a match between at least the respective portion of the first data pattern and at least the respective portion of the second data pattern. In some examples, to support outputting the indication, the indication component 940 may be configured as or otherwise support a means for outputting an indication that the first data pattern fails to match the second data pattern based at least in part on one or more of the plurality of signals indicating a mismatch between at least the respective portion of the first data pattern and at least the respective portion of the second data pattern.

Figure 10:
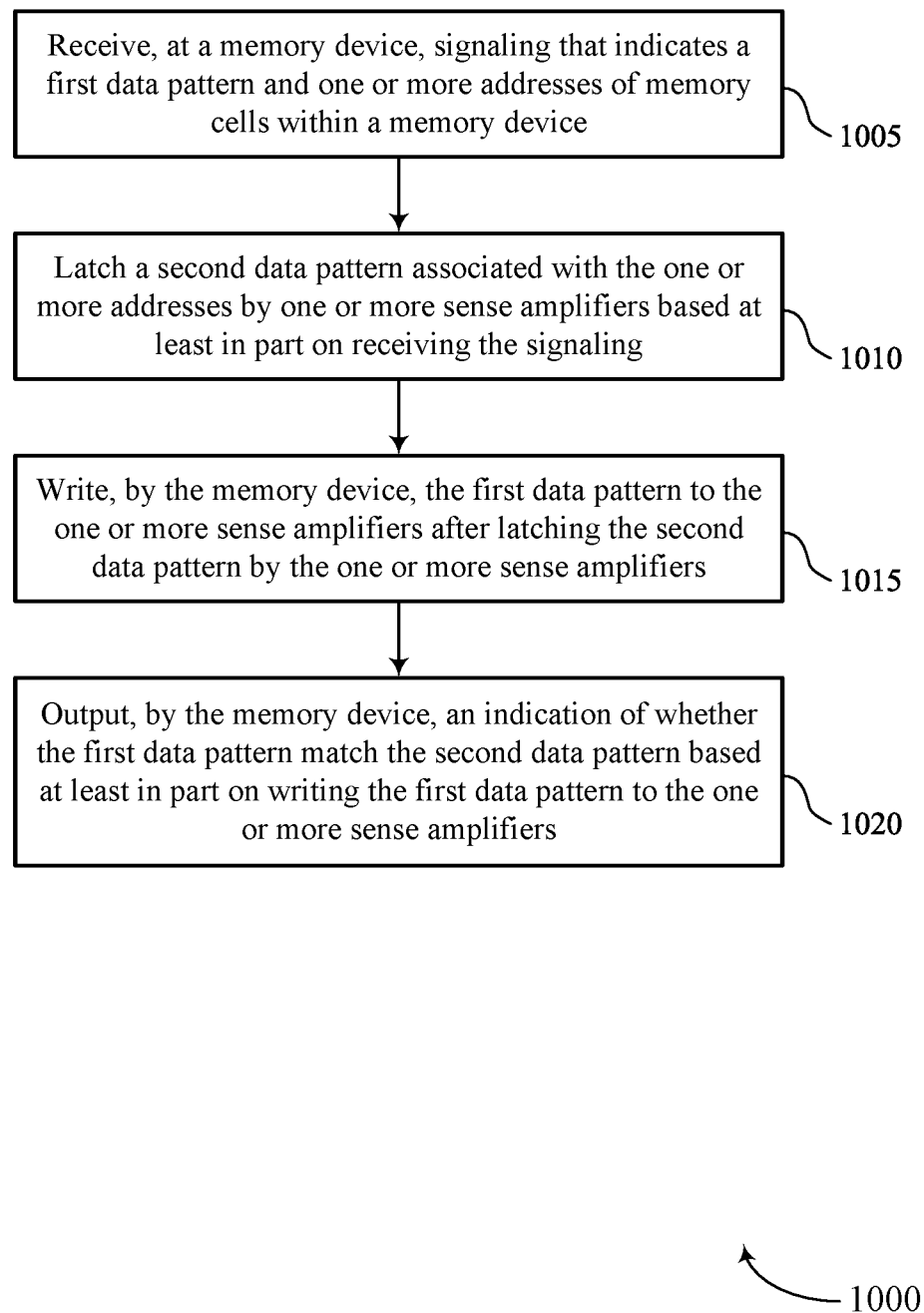
FIG. 10 shows a flowchart illustrating a method or methods that support non-destructive pattern identification at a memory device in accordance with examples as disclosed herein.

FIG. 10 shows a flowchart illustrating a method 1000 that supports non-destructive pattern identification at a memory device in accordance with examples as disclosed herein. The operations of method 1000 may be implemented by a memory device or its components as described herein. For example, the operations of method 1000 may be performed by a memory device as described with reference to FIGS. 1 through 9. In some examples, a memory device may execute a set of instructions to control the functional elements of the device to perform the described functions. Additionally, or alternatively, the memory device may perform aspects of the described functions using special-purpose hardware.

At 1005, the method may include receiving, at a memory device, signaling that indicates a first data pattern and one or more addresses of memory cells within a memory device. The operations of 1005 may be performed in accordance with examples as disclosed herein. In some examples, aspects of the operations of 1005 may be performed by a signaling reception component 925 as described with reference to FIG. 9.

At 1010, the method may include latching a second data pattern associated with the one or more addresses by one or more sense amplifiers based at least in part on receiving the signaling. The operations of 1010 may be performed in accordance with examples as disclosed herein. In some examples, aspects of the operations of 1010 may be performed by a one or more sense amplifiers 930 as described with reference to FIG. 9.

At 1015, the method may include writing, by the memory device, the first data pattern to the one or more sense amplifiers after latching the second data pattern by the one or more sense amplifiers. The operations of 1015 may be performed in accordance with examples as disclosed herein. In some examples, aspects of the operations of 1015 may be performed by a writing component 935 as described with reference to FIG. 9.

At 1020, the method may include outputting, by the memory device, an indication of whether the first data pattern matches the second data pattern based at least in part on writing the first data pattern to the one or more sense amplifiers. The operations of 1020 may be performed in accordance with examples as disclosed herein. In some examples, aspects of the operations of 1020 may be performed by an indication component 940 as described with reference to FIG. 9.

In some examples, an apparatus as described herein may perform a method or methods, such as the method 1000. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for receiving, at a memory device, signaling that indicates a first data pattern and one or more addresses of memory cells within a memory device; latching a second data pattern associated with the one or more addresses by one or more sense amplifiers based at least in part on receiving the signaling; writing, by the memory device, the first data pattern to the one or more sense amplifiers after latching the second data pattern by the one or more sense amplifiers; and outputting, by the memory device, an indication of whether the first data pattern matches the second data pattern based at least in part on writing the first data pattern to the one or more sense amplifiers.

Aspect 2: The method, apparatus, or non-transitory computer-readable medium of aspect 1 where operations, features, circuitry, logic, means, or instructions, or any combination thereof for outputting the indication include operations, features, circuitry, logic, means, or instructions, or any combination thereof for outputting an indication that the first data pattern fails to match the second data pattern based at least in part on a current associated with writing the first data pattern failing to satisfy a threshold.

Aspect 3: The method, apparatus, or non-transitory computer-readable medium of any of aspects 1 through 2 where operations, features, circuitry, logic, means, or instructions, or any combination thereof for outputting the indication include operations, features, circuitry, logic, means, or instructions, or any combination thereof for outputting an indication that the first data pattern matches the second data pattern based at least in part on a current associated with writing the first data pattern satisfying a threshold.

Aspect 4: The method, apparatus, or non-transitory computer-readable medium of any of aspects 1 through 3, further including operations, features, circuitry, logic, means, or instructions, or any combination thereof for generating an amplified current using a current mirror coupled to the one or more sense amplifiers and based at least in part on a current associated with writing the first data pattern, where the indication of whether the first data pattern matches the second data pattern is based at least in part on whether the amplified current satisfies a threshold.

Aspect 5: The method, apparatus, or non-transitory computer-readable medium of any of aspects 1 through 4, further including operations, features, circuitry, logic, means, or instructions, or any combination thereof for biasing a data line operable to couple with the one or more sense amplifiers, where a current associated with writing the first data pattern is increased in magnitude, duration, or both based at least in part on biasing the data line, and where the indication of whether the first data pattern matches the second data pattern is based at least in part on whether the current satisfies a threshold.

Aspect 6: The method, apparatus, or non-transitory computer-readable medium of aspect 5 where operations, features, circuitry, logic, means, or instructions, or any combination thereof for biasing the data line include operations, features, circuitry, logic, means, or instructions, or any combination thereof for applying a first bias based at least in part on a first trim parameter stored in the memory device and applying a second bias based at least in part on a second trim parameter stored in the memory device.

Aspect 7: The method, apparatus, or non-transitory computer-readable medium of any of aspects 1 through 6, further including operations, features, circuitry, logic, means, or instructions, or any combination thereof for activating a word line coupled to a plurality of banks of a memory array within the memory device, where latching the second data pattern is based at least in part on activating the word line and generating a plurality of signals indicating, for each bank of the plurality of banks, whether at least a respective portion of the first data pattern matches at least a respective portion of the second data pattern, where the indication of whether the first data pattern matches the second data pattern is based at least in part on inputting the plurality of signals.

Aspect 8: The method, apparatus, or non-transitory computer-readable medium of aspect 7 where operations, features, circuitry, logic, means, or instructions, or any combination thereof for outputting the indication include operations, features, circuitry, logic, means, or instructions, or any combination thereof for outputting an indication that the first data pattern matches the second data pattern based at least in part on each of the plurality of signals indicating a match between at least the respective portion of the first data pattern and at least the respective portion of the second data pattern and outputting an indication that the first data pattern fails to match the second data pattern based at least in part on one or more of the plurality of signals indicating a mismatch between at least the respective portion of the first data pattern and at least the respective portion of the second data pattern.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 9: An apparatus, including: an array of memory cells, the array including a set of word lines and a set of digit lines; one or more sense amplifiers operable to couple with the set of digit lines; a data line operable to couple with the one or more sense amplifiers; circuitry operable to generate a current based at least in part on a mismatch between first data written to the one or more sense amplifiers from the data line and second data latched by the one or more sense amplifiers; and a controller operable to cause the apparatus to: latch the second data to the one or more sense amplifiers based at least in part on activating one or more word lines of the set of word lines; deactivate the one or more word lines after latching the second data to the one or more sense amplifiers; write the first data to the one or more sense amplifiers via the data line after deactivating the one or more word lines; and output an indication of whether the first data matches the second data based at least in part on writing the first data to the one or more sense amplifiers.

Aspect 10: The apparatus of aspect 9, where the circuitry includes: a current mirror operable to: couple with one or more nodes of the one or more sense amplifiers; and amplify a current associated with writing the first data based at least in part on coupling with the one or more nodes, wherein the indication of whether the first data matches the second data is based at least in part on the amplified current.

Aspect 11: The apparatus of any of aspects 9 through 10, where the circuitry includes: biasing circuitry operable to bias the data line to increase a magnitude, duration, or both of a current associated with writing the first data, where the indication of whether the first data matches the second data is based at least in part on whether the current satisfies a threshold.

Aspect 12: The apparatus of any of aspects 9 through 11, where the circuitry includes: sequential logic operable to change state based at least in part on whether a current associated with writing the first data satisfies a threshold, where the indication of whether the first data matches the second data is based at least in part on a state of the sequential logic.

Aspect 13: The apparatus of aspect 12, where the sequential logic is operable to: output a first logic value when an input signal for the sequential logic changes state, the input signal configured to change state when the current satisfies the threshold; and output a second logic value when the current fails to satisfy the threshold.

Aspect 14: The apparatus of any of aspects 9 through 13, further including: second circuitry operable to receive a plurality of indications of whether the first data matches the second data and output a second indication of whether one or more of the plurality of indications indicates that the first data fails to match the second data; and a plurality of banks of the array, where each bank of the plurality of banks corresponds to a respective indication of the plurality of indications.

An apparatus is described. The following provides an overview of aspects of the apparatus as described herein:

Aspect 15: An apparatus, including: a memory array; and a controller operable to cause the apparatus to: receive signaling that indicates a first data pattern and one or more addresses of memory cells within memory array; latch a second data pattern associated with the one or more addresses by one or more sense amplifiers based at least in part on receiving the signaling; write the first data pattern to the one or more sense amplifiers after latching the second data pattern by the one or more sense amplifiers; and output an indication of whether the first data pattern matches the second data pattern based at least in part on writing the first data pattern to the one or more sense amplifiers.

Aspect 16: The apparatus of aspect 15, where, to output the indication, the controller is operable to cause the apparatus to: output an indication that the first data pattern fails to match the second data pattern based at least in part on a current associated with writing the first data pattern failing to satisfy a threshold.

Aspect 17: The apparatus of any of aspects 15 through 16, where, to output the indication, the controller is operable to cause the apparatus to: output an indication that the first data pattern matches the second data pattern based at least in part on a current associated with writing the first data pattern satisfying a threshold.

Aspect 18: The apparatus of any of aspects 15 through 17, where the controller is further operable to cause the apparatus to: generate an amplified current using a current mirror coupled to the one or more sense amplifiers and based at least in part on a current associated with writing the first data pattern, where the indication of whether the first data pattern matches the second data pattern is based at least in part on whether the amplified current satisfies a threshold.

Aspect 19: The apparatus of any of aspects 15 through 18, where the controller is further operable to cause the apparatus to: bias a data line operable to couple with the one or more sense amplifiers, where biasing the data line is operable to increase a magnitude, a duration, or both of a current associated with writing the first data pattern, and where the indication of whether the first data pattern matches the second data pattern is based at least in part on whether the current satisfies a threshold.

Aspect 20: The apparatus of aspect 19, where the controller is further operable to cause the apparatus to: apply a first bias based at least in part on a first trim parameter stored at the apparatus; and apply a second bias based at least in part on a second trim parameter stored at the apparatus.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (e.g., in conductive contact with, connected with, coupled with) one another if there is any electrical path (e.g., conductive path) between the components that can, at any time, support the flow of signals (e.g., charge, current voltage) between the components. At any given time, a conductive path between components that are in electronic communication with each other (e.g., in conductive contact with, connected with, coupled with) may be an open circuit or a closed circuit based on the operation of the device that includes the connected components. A conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components (e.g., over a conductive path) to a closed-circuit relationship between components in which signals are capable of being communicated between components (e.g., over the conductive path). When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial materials of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component (e.g., a transistor) discussed herein may represent a field-effect transistor (FET), and may comprise a three-terminal component including a source (e.g., a source terminal), a drain (e.g., a drain terminal), and a gate (e.g., a gate terminal). The terminals may be connected to other electronic components through conductive materials (e.g., metals, alloys). The source and drain may be conductive, and may comprise a doped (e.g., heavily-doped, degenerate) semiconductor region. The source and drain may be separated by a doped (e.g., lightly-doped) semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions (e.g., code) on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a processor, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or any type of processor. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a computer, or a processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
receiving, at a memory device, signaling that indicates a first data pattern and one or more addresses of memory cells within the memory device;
latching a second data pattern associated with the one or more addresses by one or more sense amplifiers based at least in part on receiving the signaling;
writing, by the memory device, the first data pattern to the one or more sense amplifiers after latching the second data pattern by the one or more sense amplifiers; and
outputting, by the memory device, an indication of whether the first data pattern matches the second data pattern based at least in part on writing the first data pattern to the one or more sense amplifiers, wherein the indication of whether the first data pattern matches the second data pattern is based at least in part on whether a current associated with writing the first data pattern to the one or more sense amplifiers satisfies a threshold.

2. The method of claim 1, wherein outputting the indication comprises:
outputting an indication that the first data pattern fails to match the second data pattern based at least in part on the current associated with writing the first data pattern failing to satisfy the threshold.

3. The method of claim 1, wherein outputting the indication comprises:
outputting an indication that the first data pattern matches the second data pattern based at least in part on the current associated with writing the first data pattern satisfying the threshold.

4. The method of claim 1, further comprising:
generating an amplified current using a current mirror coupled to the one or more sense amplifiers and based at least in part on a second current associated with writing the first data pattern, wherein the amplified current comprises the current associated with writing the first data pattern.

5. The method of claim 1, further comprising:
biasing a data line operable to couple with the one or more sense amplifiers, wherein the current associated with writing the first data pattern is increased in magnitude, duration, or both based at least in part on biasing the data line.

6. The method of claim 5, wherein biasing the data line comprises:
applying a first bias based at least in part on a first trim parameter stored in the memory device; and
applying a second bias based at least in part on a second trim parameter stored in the memory device.

7. The method of claim 1, further comprising:
activating a word line coupled to a plurality of banks of a memory array within the memory device, wherein latching the second data pattern is based at least in part on activating the word line; and
generating a plurality of signals indicating, for each bank of the plurality of banks, whether at least a respective portion of the first data pattern matches at least a respective portion of the second data pattern, wherein the indication of whether the first data pattern matches the second data pattern is based at least in part on inputting the plurality of signals.

8. The method of claim 7, wherein outputting the indication comprises:
outputting an indication that the first data pattern matches the second data pattern based at least in part on each of the plurality of signals indicating a match between at least the respective portion of the first data pattern and at least the respective portion of the second data pattern; or
outputting an indication that the first data pattern fails to match the second data pattern based at least in part on one or more of the plurality of signals indicating a mismatch between at least the respective portion of the first data pattern and at least the respective portion of the second data pattern.

9. An apparatus, comprising:
an array of memory cells, the array comprising a set of word lines and a set of digit lines;
one or more sense amplifiers operable to couple with the set of digit lines;
a data line operable to couple with the one or more sense amplifiers;
circuitry operable to generate a current based at least in part on a mismatch between first data written to the one or more sense amplifiers from the data line and second data latched by the one or more sense amplifiers; and
a controller operable to cause the apparatus to:
latch the second data to the one or more sense amplifiers based at least in part on activating one or more word lines of the set of word lines;
deactivate the one or more word lines after latching the second data to the one or more sense amplifiers;
write the first data to the one or more sense amplifiers via the data line after deactivating the one or more word lines; and
output an indication of whether the first data matches the second data based at least in part on writing the first data to the one or more sense amplifiers.

10. The apparatus of claim 9, wherein the circuitry comprises:
a current mirror operable to:
couple with one or more nodes of the one or more sense amplifiers; and
amplify a current associated with writing the first data based at least in part on coupling with the one or more nodes, wherein the indication of whether the first data matches the second data is based at least in part on the amplified current.

11. The apparatus of claim 9, wherein the circuitry comprises:
biasing circuitry operable to bias the data line to increase a magnitude, duration, or both of a current associated with writing the first data, wherein the indication of whether the first data matches the second data is based at least in part on whether the current satisfies a threshold.

12. The apparatus of claim 9, wherein the circuitry comprises:
sequential logic operable to change state based at least in part on whether a current associated with writing the first data satisfies a threshold, wherein the indication of whether the first data matches the second data is based at least in part on a state of the sequential logic.

13. The apparatus of claim 12, wherein the sequential logic is operable to:
output a first logic value when an input signal for the sequential logic changes state, the input signal configured to change state when the current satisfies the threshold; and
output a second logic value when the current fails to satisfy the threshold.

14. The apparatus of claim 9, further comprising:
second circuitry operable to receive a plurality of indications of whether the first data matches the second data and output a second indication of whether one or more of the plurality of indications indicates that the first data fails to match the second data; and
a plurality of banks of the array, wherein each bank of the plurality of banks corresponds to a respective indication of the plurality of indications.

15. An apparatus, comprising:
a memory array; and
a controller operable to cause the apparatus to:
receive signaling that indicates a first data pattern and one or more addresses of memory cells within the memory array;
latch a second data pattern associated with the one or more addresses by one or more sense amplifiers based at least in part on receiving the signaling;
write the first data pattern to the one or more sense amplifiers after latching the second data pattern by the one or more sense amplifiers; and
output an indication of whether the first data pattern matches the second data pattern based at least in part on writing the first data pattern to the one or more sense amplifiers, wherein the indication of whether the first data pattern matches the second data pattern is based at least in part on whether a current associated with writing the first data pattern to the one or more sense amplifiers satisfies a threshold.

16. The apparatus of claim 15, wherein, to output the indication, the controller is operable to cause the apparatus to:
output an indication that the first data pattern fails to match the second data pattern based at least in part on the current associated with writing the first data pattern failing to satisfy the threshold.

17. The apparatus of claim 15, wherein, to output the indication, the controller is operable to cause the apparatus to:
output an indication that the first data pattern matches the second data pattern based at least in part on the current associated with writing the first data pattern satisfying the threshold.

18. The apparatus of claim 15, wherein the controller is further operable to cause the apparatus to:
generate an amplified current using a current mirror coupled to the one or more sense amplifiers and based at least in part on a second current associated with writing the first data pattern, wherein the amplified current comprises the current associated with writing the first data pattern.

19. The apparatus of claim 15, wherein the controller is further operable to cause the apparatus to:
bias a data line operable to couple with the one or more sense amplifiers, wherein biasing the data line is operable to increase a magnitude, a duration, or both of the current associated with writing the first data pattern.

20. The apparatus of claim 19, wherein the controller is further operable to cause the apparatus to:
apply a first bias based at least in part on a first trim parameter stored at the apparatus; and
apply a second bias based at least in part on a second trim parameter stored at the apparatus.

* * * * *